United States Patent
Ahn et al.

(10) Patent No.: US 9,660,089 B2
(45) Date of Patent: May 23, 2017

(54) THIN FILM TRANSISTOR SUBSTRATE AND METHOD OF MANUFACTURING THE SAME

(71) Applicant: SAMSUNG DISPLAY CO., LTD., Yongin, Gyeonggi-Do (KR)

(72) Inventors: Byung-Du Ahn, Hwaseong-si (KR); Ji-Hun Lim, Goyang-si (KR); Jin-Hyun Park, Yongin-si (KR); Hyun-Jae Kim, Seoul (KR)

(73) Assignee: SAMSUNG DISPLAY CO., LTD, Gyeonggi-Do (KR)

( * ) Notice: Subject to any disclaimer, the term of this patent is extended or adjusted under 35 U.S.C. 154(b) by 60 days.

(21) Appl. No.: 14/467,848

(22) Filed: Aug. 25, 2014

(65) Prior Publication Data
US 2015/0069382 A1    Mar. 12, 2015

(30) Foreign Application Priority Data
Sep. 10, 2013  (KR) .......................... 10-2013-0108343

(51) Int. Cl.
*H01L 29/786*  (2006.01)
*H01L 27/12*  (2006.01)

(52) U.S. Cl.
CPC .... *H01L 29/78633* (2013.01); *H01L 27/1218* (2013.01); *H01L 27/1225* (2013.01); *H01L 27/1262* (2013.01); *H01L 29/7869* (2013.01)

(58) Field of Classification Search
CPC .......... H01L 29/78633; H01L 27/3272; G02F 1/136209
See application file for complete search history.

(56) References Cited

U.S. PATENT DOCUMENTS 7,288,789 B2    10/2007  Yamazaki et al.
2002/0001887 A1*  1/2002  Sung ..................... H01L 27/12
                                                                438/156
(Continued)

FOREIGN PATENT DOCUMENTS

JP       08165444 A       6/1996
JP       2006309957 A     11/2006
JP       2008102197 A     5/2008
(Continued)

OTHER PUBLICATIONS

Godlewsk, M., et al., "Optical Properties of Manganese doped WIde Band Gap ZnS and ZnO," Optical Matls., 31, 2009, 1768-1771.*

(Continued)

*Primary Examiner* — Dale E Page
*Assistant Examiner* — John Bodnar
(74) *Attorney, Agent, or Firm* — Cantor Colburn LLP

(57) ABSTRACT

A thin film transistor substrate includes a substrate, a data line disposed on the substrate and which extends substantially in a predetermined direction, a light blocking layer disposed on the substrate and including a metal oxide including zinc manganese oxide, zinc cadmium oxide, zinc phosphorus oxide or zinc tin oxide, a gate electrode disposed on the light blocking layer, a signal electrode including a source electrode and a drain electrode spaced apart from the source electrode, where the source electrode is connected to the data line, and a semiconductor pattern disposed between the source electrode and the drain electrode.

9 Claims, 8 Drawing Sheets

(56) References Cited

U.S. PATENT DOCUMENTS

2010/0091219 A1* 4/2010 Rho ................ G02F 1/133512
  349/68
2011/0147740 A1* 6/2011 Jeong ................ H01L 29/78606
  257/43

FOREIGN PATENT DOCUMENTS

| KR | 100659528 B1 | 4/2005 |
| KR | 1020060001753 A | 1/2006 |
| KR | 1020060114744 A | 11/2006 |
| KR | 1020090127535 A | 12/2009 |
| KR | 1020110024509 A | 3/2011 |
| KR | 1020110049562 A | 5/2011 |
| KR | 1020110052948 A | 5/2011 |
| KR | 1020140020602 A | 2/2014 |

OTHER PUBLICATIONS

Godlewski et al., "Optical Properties of Manganese Doped Wide Band Gap ZnS and ZnO." Optical Materials, 31, (2009), pp. 1768-1771.*
Li et al. ("Effects Of Doping Concentration On Properties Of Mn Doped ZnO Thin Films", Chin. Phys. Soc. and IOP publishing Ltd, vol. 18, No. 10 (Oct. 2009), pp. 4536-4540.*

* cited by examiner

THIN FILM TRANSISTOR SUBSTRATE AND METHOD OF MANUFACTURING THE SAME

This application claims priority to Korean Patent Application No. 10-2013-0108343, filed on Sep. 10, 2013, and all the benefits accruing therefrom under 35 U.S.C. §119, the content of which are incorporated by reference herein in its entirety.

BACKGROUND

1. Field

Exemplary embodiments of the invention relate to a thin film transistor substrate and a method of manufacturing the thin film transistor. More particularly, exemplary embodiments relate to a thin film transistor substrate in a display apparatus and a method of manufacturing the thin film transistor.

2. Description of the Related Art

Generally, a thin film transistor, which is typically used to drive a pixel in a display apparatus, includes a gate electrode, a source electrode, a drain electrode and a channel layer, in which a channel between the source electrode and the drain electrode is formed. The channel layer typically includes a semiconductor layer including amorphous silicon, poly silicon or oxide semiconductor.

Recently, a light blocking layer including a metal has been developed to prevent degradation of the thin film transistor due to an ultraviolet ray. When a thin film transistor substrate including the light blocking layer is manufactured, a mask is used to form a light blocking pattern.

However, in a conventional display apparatus, where a thin film transistor thereof includes a light blocking layer having the metal, a light transmittance of a display panel and a manufacturing yield thereof may be deteriorated.

SUMMARY

One or more exemplary embodiment of the invention provides a thin film transistor substrate, in which degradation due to an ultraviolet ray is effectively prevented.

One or more exemplary embodiments of the invention also provide a method of manufacturing the thin film transistor.

According to an exemplary embodiment of the invention, a thin film transistor includes a substrate, a data line disposed on the substrate and which extends substantially in a predetermined direction, a light blocking layer disposed on the substrate and including metal oxide including zinc manganese oxide, zinc cadmium oxide, zinc phosphorus oxide or zinc tin oxide, a gate electrode disposed on the light blocking layer, a signal electrode including a source electrode and a drain electrode spaced apart from the source electrode, where the source electrode is connected to the data line, and a semiconductor pattern disposed between the source electrode and the drain electrode.

In an exemplary embodiment, the light blocking layer may include zinc manganese oxide, and atomic percent of manganese in the zinc manganese oxide may be in a range from about 15 atomic percent to about 70 atomic percent.

In an exemplary embodiment, the light blocking layer may absorb an ultraviolet ray of the thin film transistor substrate from external ultraviolet ray.

In an exemplary embodiment, the light blocking layer may cover substantially entire of a surface of the substrate.

In an exemplary embodiment, the thin film transistor substrate may further include a gate insulation layer disposed on the semiconductor pattern, where the gate electrode may be disposed on the gate insulation layer.

In an exemplary embodiment, the thin film transistor substrate may further include a gate insulation layer disposed under the semiconductor pattern, where the gate electrode may be disposed on the gate insulation layer.

In an exemplary embodiment, the thin film transistor substrate may further include an etch stopper disposed on the semiconductor pattern.

In an exemplary embodiment, the thin film transistor substrate may further a gate line electrically connected to the gate electrode, where the gate electrode extends from the gate line.

In an exemplary embodiment, the thin film transistor substrate may further a passivation layer and a pixel electrode electrically connected to the drain electrode through a contact hole defined in the passivation layer.

In an exemplary embodiment, the source electrode and the drain electrode may include a copper (Cu) layer and a titanium (Ti) layer which is disposed on the copper layer or under the copper layer.

In an exemplary embodiment, the semiconductor pattern may include zinc oxide (ZnO), zinc tin oxide, zinc indium oxide, indium oxide (InO), titanium oxide (TiO), indium gallium zinc oxide, indium tin zinc oxide, hafnium indium zinc oxide or a combination thereof.

According to an exemplary embodiment of the invention, a method of manufacturing a thin film transistor substrate includes providing a light blocking layer on a substrate, where the light blocking layer includes a metal oxide including zinc manganese oxide, zinc cadmium oxide, zinc phosphorus oxide or zinc tin oxide, providing a gate metal layer on the light blocking layer and patterning the gate metal layer to form a gate electrode, providing a gate insulation layer on the substrate to cover the gate electrode, providing a signal electrode electrically connected to a data line, and providing a semiconductor pattern on the substrate.

In an exemplary embodiment, the light blocking layer may include zinc manganese oxide, and atomic percent of manganese in the zinc manganese oxide may be in a range from about 15 atomic percent to about 70 atomic percent.

In an exemplary embodiment, the light blocking layer may absorb an ultraviolet ray.

In an exemplary embodiment, the light blocking layer may cover substantially entire of a surface of the substrate.

In an exemplary embodiment, the providing the light blocking layer may include using a sputtering process or a solution coating process.

In an exemplary embodiment, the method may further include providing an etch stopper to overlap a portion of the semiconductor pattern, providing a signal metal layer on the etch stopper, and etching a portion of the signal metal layer corresponding to a region between a first end and a second end of the etch stopper to form a source electrode and a drain electrode.

In an exemplary embodiment, the method may further include providing a passivation layer on the signal electrode, providing a protection layer on the passivation layer, forming a contact hole through the passivation layer and the protection layer to expose a portion of the drain electrode, and providing a pixel electrode on the protection layer to be electrically connected to the drain electrode through the contact hole.

In an exemplary embodiment, the signal electrode may include a copper (Cu) layer and a titanium (Ti) layer disposed on the copper layer or under the copper layer.

In an exemplary embodiment, the semiconductor pattern may include zinc oxide (ZnO), zinc tin oxide, zinc indium oxide, indium oxide (InO), titanium oxide (TiO), indium gallium zinc oxide, indium tin zinc oxide, hafnium indium zinc oxide or a combination thereof.

According to the exemplary embodiments of the invention described herein, the thin film transistor substrate includes a light blocking layer including zinc manganese oxide, such that a transmittance of visible light of about 380 nanometers (nm) to about 780 nm of wavelength and a light absorption of ultraviolet ray of zero (0) nm to about 380 nm of wavelength may be improved. Thus, a degradation of a display panel may be effectively prevented by ultraviolet ray and a reliability of a display panel may be improved.

In such embodiments, a mask is not used when the light blocking layer including zinc manganese oxide is manufactured. Thus, cost of manufacturing a display panel may be reduced.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
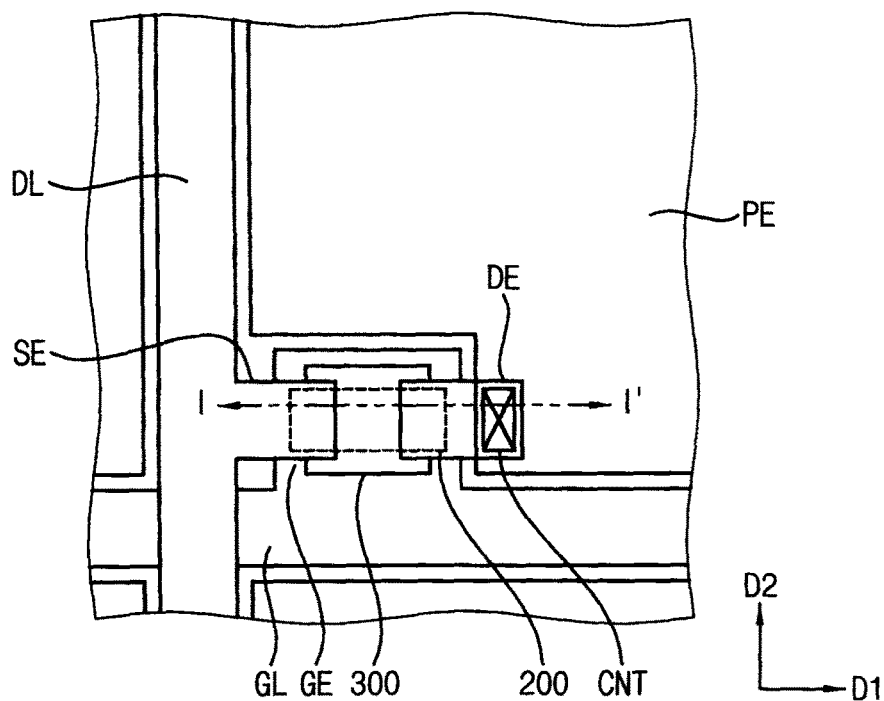
FIG. 1 is a plan view of a portion of an exemplary embodiment of a thin film transistor substrate, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 2:
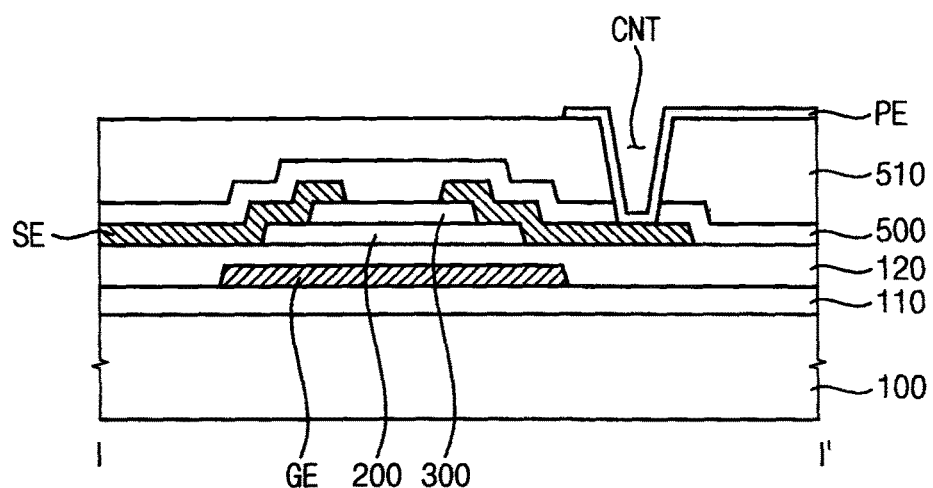
FIG. 2 is a cross-sectional view taken along line I-I' of FIG. 1.

FIG. 1 is a plan view of a portion of an exemplary embodiment of a thin film transistor substrate, according to the invention, and FIG. 2 is a cross-sectional view taken along line I-I' of FIG. 1.

Referring to FIGS. 1 and 2, an exemplary embodiment of a thin film transistor substrate includes a substrate 100, a gate line GL, a data line DL, a thin film transistor, a protection layer 510 and a pixel electrode PE. The thin film transistor includes a light blocking layer 110, a gate electrode GE, a gate insulation layer 120, an oxide semiconductor pattern 200, an etch stopper 300, a signal electrode and a passivation layer 500.

The substrate 100 includes a transparent conductive material. In one exemplary embodiment, for example, the substrate 100 may include glass, quartz, plastic, polyethylene terephthalate resin, polyethylene resin or polycarbonate resin, for example. In an exemplary embodiment, the substrate 100 may be a flexible substrate.

The light blocking layer 110 is disposed on the substrate 100. The light blocking layer 110 includes a metal oxide or transparent materials, for example. The light blocking layer 110 may absorb an ultraviolet ray and allow visible light to pass therethrough.

In one exemplary embodiment, for example, the metal oxide of the light blocking layer 110 may include zinc manganese oxide, zinc cadmium oxide, zinc phosphorus oxide or zinc tin oxide, for example.

In one exemplary embodiment, for example, the light blocking layer 110 may include zinc manganese oxide, and a thickness of the light blocking layer 110 may be in a range from about 500 nanometers (nm) to about 1 micrometer (μm).

TABLE 1

| | Manganese(Mn) content of zinc manganese oxide (atomic percent) | | | | | | | |
|---|---|---|---|---|---|---|---|---|
| | 0 at % | 5 at % | 10 at % | 15 at % | 20 at % | 40 at % | 60 at % | 80 at % |
| Transmittance (wavelength: 380-750 nm) | 94.3 | 93.5 | 87.8 | 88.4 | 85.1 | 78.0 | 74.8 | 66.3 |
| Light Absorption (wavelength: 200-380 nm) | 1.79 | 1.85 | 1.92 | 2.11 | 2.14 | 2.31 | 2.17 | 1.97 |

Table 1 represents a transmittance of visible light in a wavelength range of 380 nm to 750 nm and a light absorption of ultraviolet ray in a wavelength range of 200 nm to 380 nm according to manganese (Mn) content of zinc manganese oxide (ZnMnO).

Referring to Table 1, when manganese (Mn) content of zinc manganese oxide (ZnMnO) is increased, the transmittance of visible light is decreased, and the light absorption of ultraviolet ray reaches to maximum absorption and then is gradually decreased. Thus, in an exemplary embodiment, where the metal oxide of the light blocking layer 110 may include zinc manganese oxide (ZnMnO), manganese (Mn) content of zinc manganese oxide (ZnMnO) may be in a range from about 15 at % to about 70 at % such that the transmittance of ultraviolet ray is substantially decreased while substantially maintaining the transmittance of visible light.

In an exemplary embodiment, the gate line GL is disposed on the light blocking layer 110 and extends substantially in a first direction D1. The gate line GL may include a copper layer. The gate line GL may have a multi-layered structure of a copper layer and a conductive layer stacked on each other. In one exemplary embodiment, for example, the conductive layer of the gate line GL may include copper oxide (CuOx), gallium doped zinc oxide ("GZO"), indium doped zinc oxide ("IZO"), or copper-manganese alloy (CuMn), for example. A gate on/off signal may be applied to the gate line GL from a gate driving part (not shown) to drive the thin film transistor.

The gate electrode GE is electrically connected to the gate line GL. The gate electrode GE may include substantially the same material as the gate line GL. In one exemplary embodiment, for example, the gate electrode GE may be integrally formed with the gate line GL as a single unitary and indivisible unit. In an alternative exemplary embodiment, the gate electrode GE may be spaced apart from the gate line GL by an insulation layer therebetween and may be electrically connected to the gate line GL through a contact hole defined in the insulation layer.

The gate insulation layer 120 is disposed on the substrate 100, where the gate electrode GE and the light blocking layer 110 are disposed. The gate insulation layer 120 covers the gate line GL and the gate electrode GE. In one exemplary embodiment, for example, the gate insulation layer 110 may include silicon oxide or silicon nitride, for example.

The data line DL is disposed on the substrate 100 and extends substantially in a second direction D2, which is perpendicular to the first direction D1. In one exemplary embodiment, for example, the data line DL may include titanium (Ti) or titanium oxide (TiOx). According to an exemplary embodiment, the data line DL may have a single-layered structure including a single metal layer or a multi-layered structure including a plurality of metal layers. In one exemplary embodiment, for example, the data line DL may have a first metal pattern including titanium (Ti) and a second metal pattern including aluminum (Al), copper (Cu), molybdenum (Mo), tantalum (Ta), tungsten (W), neodymium (Nd), chromium (Cr), or silver (Ag), for example. In one exemplary embodiment, for example, the data line DL includes a copper (Cu) layer and a titanium (Ti) layer disposed under the copper (Cu) layer.

The oxide semiconductor pattern 200 is disposed on the substrate 100 where the gate insulation layer 120 is disposed. The oxide semiconductor pattern 200 has a predetermined width along the second direction D2 and overlaps the gate electrode GE. In one exemplary embodiment, for example, the oxide semiconductor pattern 200 may include indium (In), zinc (Zn), gallium (Ga), tin (Sn), or hafnium (Hf), for example. In one exemplary embodiment, for example, the oxide semiconductor pattern 200 may include zinc oxide (ZnO), zinc tin oxide, zinc indium oxide, indium oxide (InO), titanium oxide (TiO), indium gallium zinc oxide ("IGZO"), indium tin zinc oxide ("ITZO") or hafnium indium zinc oxide ("HIZO").

The etch stopper 300 is disposed on the substrate 100, where the oxide semiconductor pattern 200 is provided. The etch stopper 300 overlaps a portion of the oxide semiconductor pattern 200. In one exemplary embodiment, for example, the etch stopper 300 may include an insulation material such as silicon oxide.

The signal electrode includes a source electrode SE and a drain electrode DE. The source electrode SE is disposed on the substrate 100, where the etch stopper 300 is disposed. The source electrode SE overlaps an end portion (e.g., a first end portion) of the oxide semiconductor pattern 200 and the etch stopper 300. The drain electrode DE is disposed on the substrate 100 where the etch stopper 300 is disposed. The drain electrode DE overlaps another end portion (e.g., a second end portion opposite to the first end portion) of the oxide semiconductor pattern 200 and the etch stopper 300. The source electrode SE and the drain electrode DE are spaced apart from each other by the oxide semiconductor pattern 200 therebetween. According to an exemplary embodiment, the source electrode SE may include the same material as the drain electrode DE. In one exemplary embodiment, for example, the source electrode SE and the drain electrode DE may include titanium (Ti), or titanium oxide (TiOx). In an exemplary embodiment, as shown in FIG. 2, each of the source electrode SE and the drain electrode DE has a single-layered structure, but structures of the source electrode SE and the drain electrode DE are not limited thereto. In an alternative exemplary embodiment, the source electrode SE and the drain electrode DE may have multi-layered structures including a plurality of metal layers. In one exemplary embodiment, for example, the source electrode SE and the drain electrode DE may have a have multi-layered structure including a first metal pattern and a second metal pattern. In such an embodiment, the first metal pattern may include titanium (Ti), and the second metal pattern may include aluminum (Al), copper (Cu), molybdenum (Mo), tantalum (Ta), tungsten (W), neodymium (Nd), chromium (Cr) or silver (Ag), for example. In an exemplary embodiment, the first metal pattern and the second metal pattern may be stacked on each other. In one exemplary embodiment, for example, each of the source electrode SE and the drain electrode DE includes a copper (Cu) layer and a titanium (Ti) layer under the copper (Cu) layer.

The source electrode SE electrically connects the oxide semiconductor pattern 200 and the data line DL. The source electrode SE may directly contact an end portion (e.g., a first end portion) of the oxide semiconductor pattern 200. The source electrode SE may be integrally formed with the data line DL as a single unitary and indivisible unit. In an alternative exemplary embodiment, the source electrode SE may be spaced apart from the data line DL by an insulation layer therebetween and may be electrically connected to the data line DL through a contact hole defined in the insulation layer.

The drain electrode DE electrically connects the oxide semiconductor pattern 200 (e.g., an end portion of the oxide semiconductor pattern 200) and the pixel electrode PE. The drain electrode DE may directly contact another end portion (e.g., a second end portion opposite to the first end portion) of the oxide semiconductor pattern 200.

The passivation layer 500 is disposed on the substrate 100, where the signal electrode is disposed. The passivation layer 500 covers the source electrode SE, the drain electrode DE and an exposed portion of the etch stopper 300. In one exemplary embodiment, for example, the passivation layer 500 may include silicon nitride (SiNx). In one exemplary embodiment, for example, the passivation layer 500 may be formed on the etch stopper 300 by a chemical vapor deposition ("CVD") process using a mixed gas of silicon hydride and ammonia (NH₃).

The protection layer 510 is disposed on the substrate 100 where the passivation layer 500 is disposed. The protection layer 510 may have a substantially flat upper surface. The protection layer 510 may include an organic insulation material such as photoresist composition including acryl resin or phenol resin, for example.

The pixel electrode PE is electrically connected to the drain electrode DE through a contact hole CNT defined through the passivation layer 500 and the protection layer 510. The pixel electrode PE may include a transparent conductive material. In one exemplary embodiment, for example, the pixel electrode PE may include IZO, indium tin oxide ("ITO"), tin oxide (SnOx), zinc oxide (ZnOx), etc. In an alternative exemplary embodiment, the pixel electrode PE may include metal having high reflectivity. In one exemplary embodiment, for example, the pixel electrode PE may include aluminum (Al), platinum (Pt), silver (Ag), gold (Au), chromium (Cr), tungsten (W), molybdenum (Mo), titanium (Ti) or a combination thereof.

Figure 3:
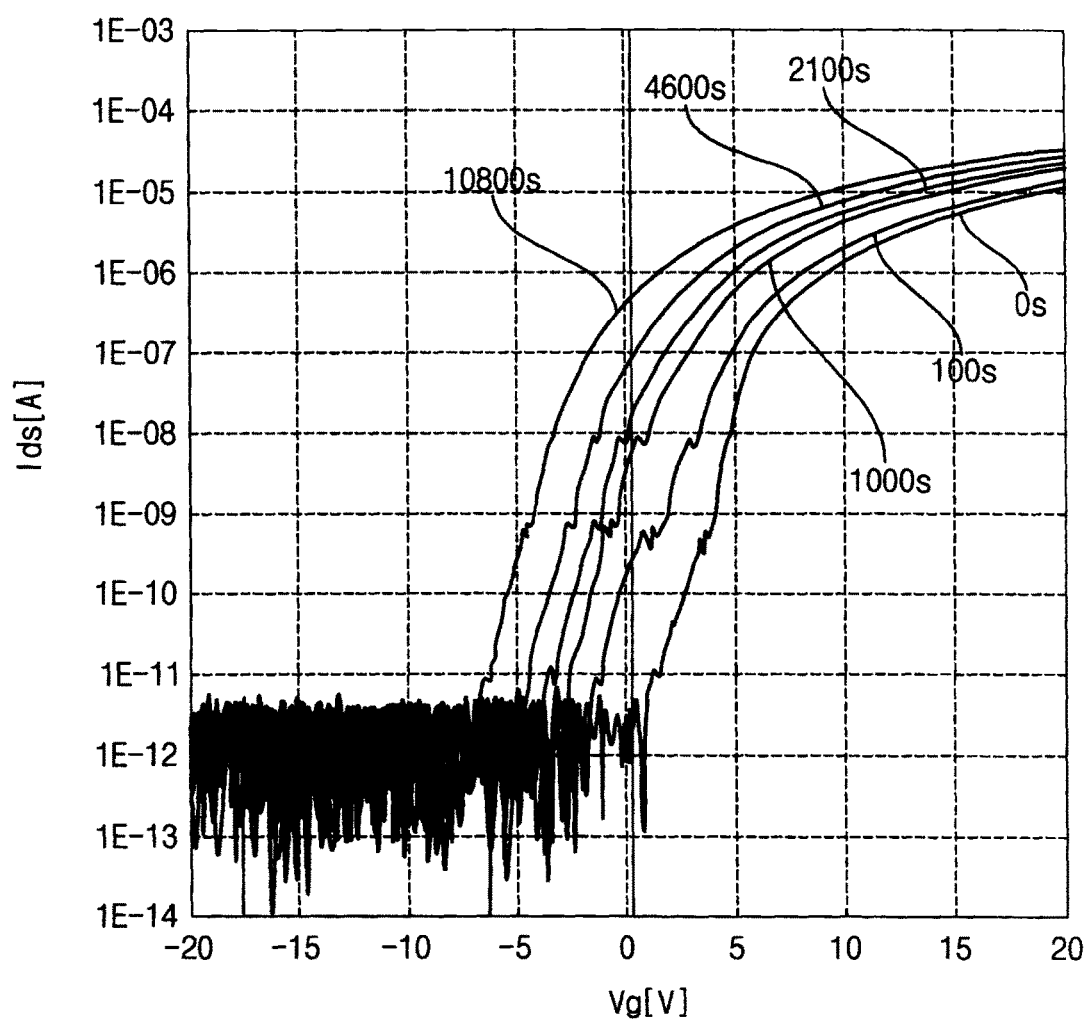
FIG. 3 is a graph illustrating conductive properties of a conventional thin film transistor.
Figure 4:
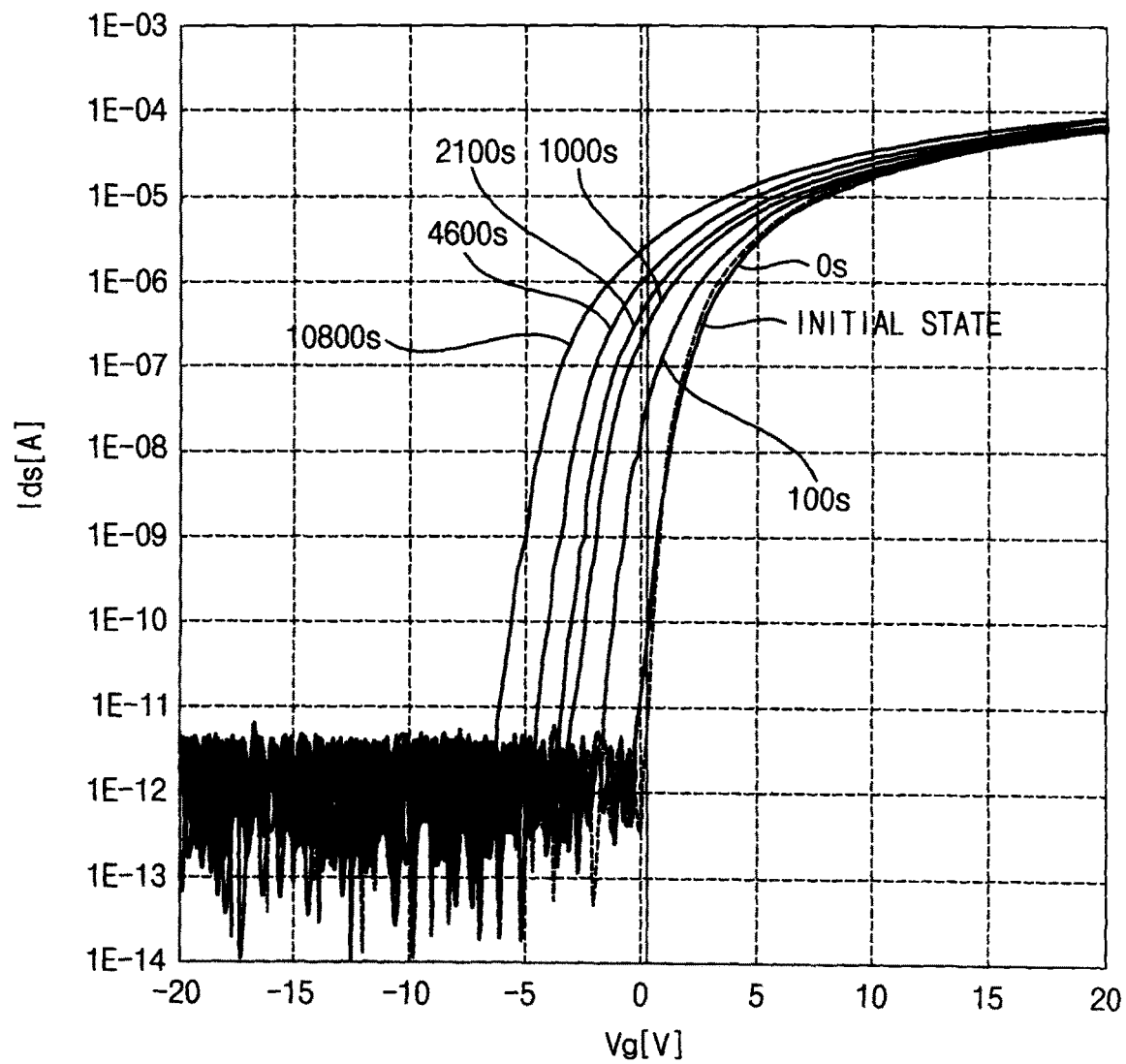
FIG. 4 is a graph illustrating conductive properties of an exemplary embodiment of a thin film transistor of the thin film transistor substrate of FIG. 1.

FIG. 3 is a graph illustrating conductive properties of a conventional thin film transistor. FIG. 4 is a graph illustrating conductive properties of an exemplary embodiment of a thin film transistor of the thin film transistor substrate of FIG. 1.

FIG. 3 is a graph illustrating current levels Ids (ampere: A) versus gate voltage Vg (volt: V) with respect to driving hour (second) separated as 0 s, 100 s, 1000 s, 2100 s and 4600 s of a conventional thin film transistor. FIG. 4 is a graph illustrating current levels Ids (ampere: A) versus gate voltage Vg (volt: V) with respect to driving hour (second) separated as 0 s, 100 s, 1000 s, 2100 s and 4600 s of an exemplary embodiment of the thin film transistor of FIG. 1, according to the invention.

Referring to FIG. 3, a reliability value corresponding to absolute value of difference between a gate voltage Vg of zero second (0s) and a gate voltage Vg of 10,800 s of conventional thin film transistor substrate is about 8.3 V.

Referring to FIG. 4, a reliability value corresponding to absolute value of difference between a gate voltage Vg of zero second (0s) or initial state and a gate voltage Vg of 10,800 s of a thin film transistor substrate including 20% manganese of zinc manganese oxide according to an exemplary embodiment of the invention is about 5 V. In an exemplary embodiment, the current level Ids may rapidly arrive at a predetermined current level when the gate voltage Vg is less than about 10 volts. Thus, in an exemplary embodiment, a degradation of a display panel due to an ultraviolet ray may be effectively prevented and a reliability of a display panel may be improved.

In an exemplary embodiment, as shown in FIGS. 1 and 2, a thin film transistor substrate may include a bottom gate structure, where a gate electrode is disposed under a channel layer, but not being limited thereto. In an alternative exemplary embodiment, the thin film transistor may include a top gate structure where a gate electrode is disposed on a channel layer. In an exemplary embodiment, a source electrode and a drain electrode is disposed in or formed from a different layer from a channel layer. In an alternative exemplary embodiment, a thin film transistor may include a self-aligned structure, where a source electrode and a drain electrode are disposed in or formed from same layer as a channel layer.

FIGS. 5 to 16 are cross-sectional views illustrating an exemplary embodiment of a method of manufacturing the thin film transistor substrate of FIG. 1.

Figure 5:
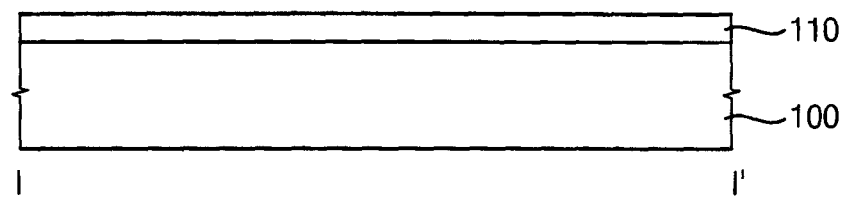
FIGS. 5 to 16 are cross-sectional views illustrating an exemplary embodiment of a method of manufacturing the thin film transistor substrate of FIG. 1.

Referring to FIG. 5, a light blocking layer 110 is provided, e.g., formed, on a substrate 100. In such an embodiment, the light blocking layer 110 may include metal oxide. The light blocking layer may absorb an external ultraviolet ray and allow external visible light to pass therethrough.

In one exemplary embodiment, for example, the metal oxide may include zinc manganese oxide, zinc cadmium oxide, zinc phosphorus oxide or zinc tin oxide, for example.

In an exemplary embodiment, the light blocking layer 110 may include zinc manganese oxide, and a thickness of the light blocking layer 110 may be in a range from about 500 nm to about 1 μm. In such an embodiment, atomic percent of manganese in the zinc manganese oxide may be in a range from about 15 at % to about 70 at %.

In an exemplary embodiment, the light blocking layer may be formed by a vacuum deposition process such as a sputtering process or a solution printing process using a solution of zinc manganese oxide.

Figure 6:
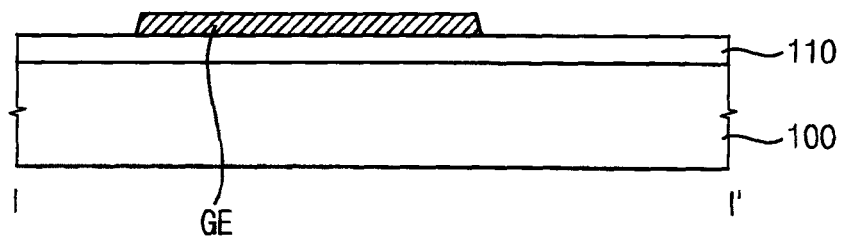

Referring to FIG. 6, a gate metal layer is provided on the light blocking layer 110, and the gate metal layer is patterned to form a gate electrode GE. The gate metal layer may include a copper layer. The gate metal layer may have a multi-layered structure of a copper layer and a conductive layer stacked on each other. In one exemplary embodiment, for example, the conductive layer may include copper oxide (CuOx), GZO, IZO or copper-manganese alloy (CuMn).

Figure 7:
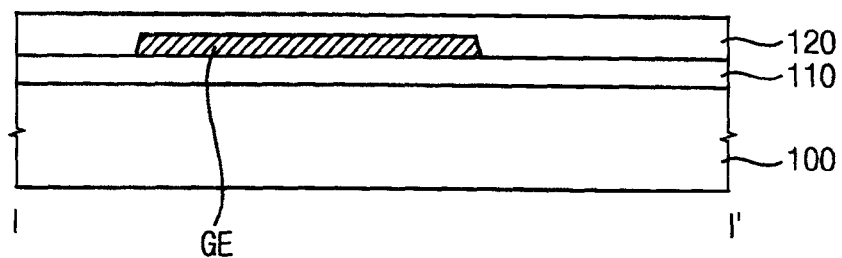

Referring to FIG. 7, a gate insulation layer 120 is provided on the substrate 100, where the gate electrode GE is disposed. In an exemplary embodiment, the gate insulation layer 120 may include an inorganic material such as silicon nitride (SiNx) and silicon oxide (SiOx), for example. In an alternative exemplary embodiment, the gate insulation layer 120 may include a transparent organic material. The gate insulation layer 120 may be provided by a CVD process or an organic layer coating process.

Figure 8:
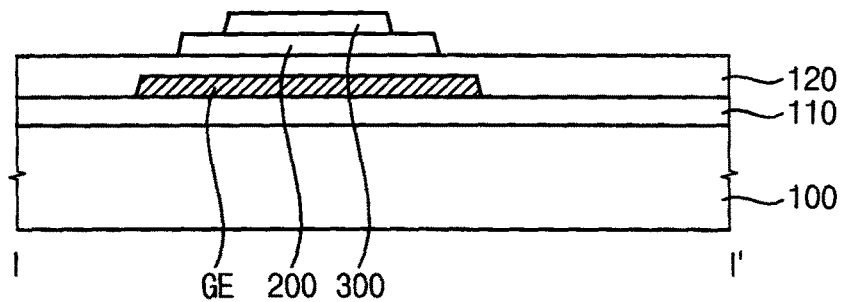

Referring to FIG. 8, an oxide semiconductor pattern 200 is provided on the substrate 100 where the gate insulation layer 120 is disposed. An etch stopper 300 is then provided on the oxide semiconductor pattern 200 such that the etch stopper 300 overlaps a portion of the oxide semiconductor pattern 200. The oxide semiconductor pattern 200 overlaps the gate electrode GE and has a predetermined width. In one exemplary embodiment, for example, the oxide semiconductor pattern 200 may include indium (In), zinc (Zn), gallium (Ga), tin (Sn), or hafnium (Hf), for example. In one exemplary embodiment, for example, the oxide semiconductor pattern 200 may include zinc oxide (ZnO), zinc tin oxide, zinc indium oxide, indium oxide (InO), titanium oxide (TiO), IGZO, ITZO, or HIZO, for. In one exemplary embodiment, for example, the etch stopper 300 may include an insulation material such as silicon oxide (SiOx).

Figure 9:
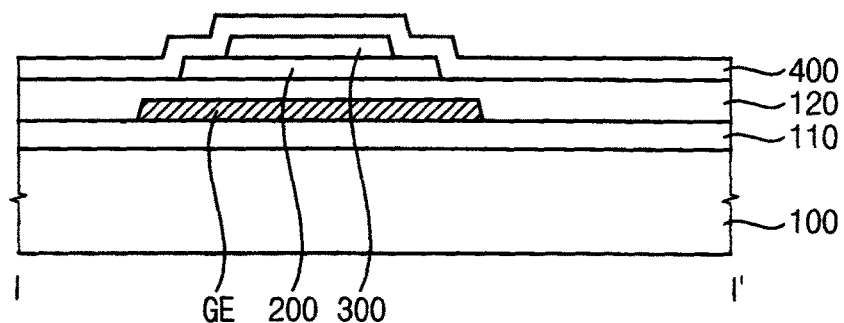

Referring to FIG. 9, a signal metal layer 400 is provided on the substrate 100 where the etch stopper 300 is disposed. In one exemplary embodiment, for example, the signal metal layer 400 may include titanium (Ti), aluminum (Al), copper (Cu), molybdenum (Mo), tantalum (Ta), tungsten (W), neodymium (Nd), chromium (Cr), or silver (Ag), for example.

Figure 10:
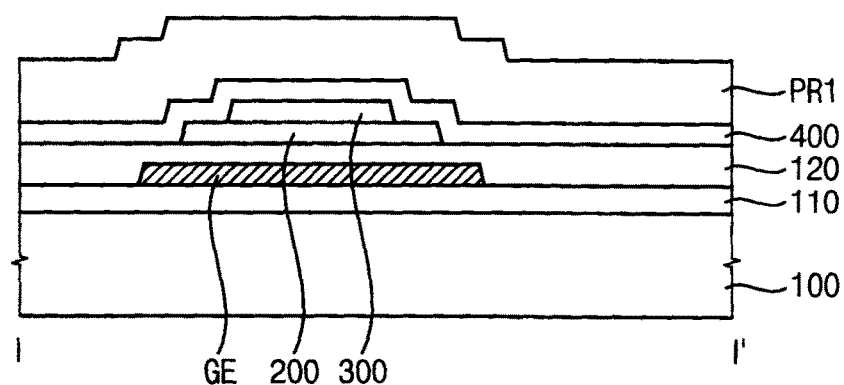

Referring to FIG. 10, a photoresist layer PR1 is provided on the substrate 100 where the signal metal layer 400 is disposed. In one exemplary embodiment, for example, the photoresist layer PR1 may include positive-type photoresist composition whose area illuminated by light is removed by developer and whose area non-illuminated by the light is hardened to remain. In an exemplary embodiment, the photoresist layer PR1 may be provided on the signal metal layer 400 by spin-coating process or slit-coating process.

Figure 11:
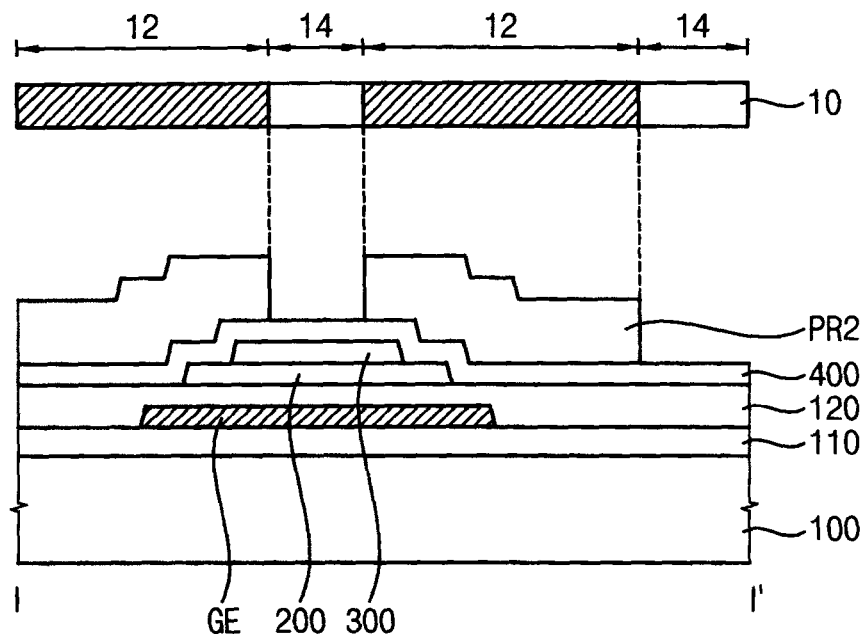

Referring to FIG. 11, a mask 10 is disposed on the substrate 100 where the photoresist layer PR1 is provided. The mask 10 includes a light blocking portion 12 and an opening portion 14. The light blocking portion 12 of the mask 10 may be disposed to correspond to or to overlap a source area, a drain area and a data line area of the thin film transistor substrate. The opening portion 14 of the mask 10 may be disposed to correspond to or to overlap a remaining area of the thin film transistor substrate except for the source area, the drain area and the data line area. In one exemplary embodiment, for example, the opening portion 14 of the mask 10 may correspond to a pixel area and a portion of the etch stopper 300.

Then, light having a predetermined wavelength is illuminated above the mask 10 toward the substrate 100 where the photoresist layer PR1 is provided. A portion of the positive-type photoresist composition, which is exposed by the light, is removed by developer. Accordingly, a photoresist pattern PR2 is provided on the signal metal layer 400.

In an alternative exemplary embodiment, the photoresist layer PR1 may include negative-type photoresist composition whose area illuminated by light is hardened to remain and whose area non-illuminated by the light is removed by developer. In such an embodiment, an arrangement of the light blocking portion 12 and the opening portion 14 of the mask 10 may be reversed.

Figure 12:
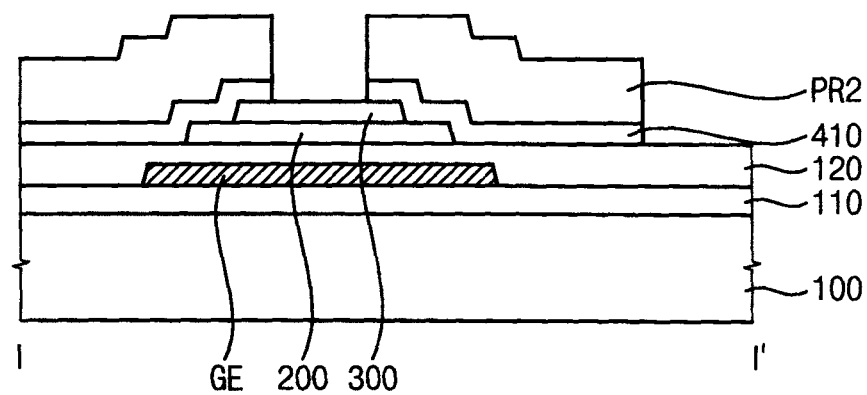
Figure 13:
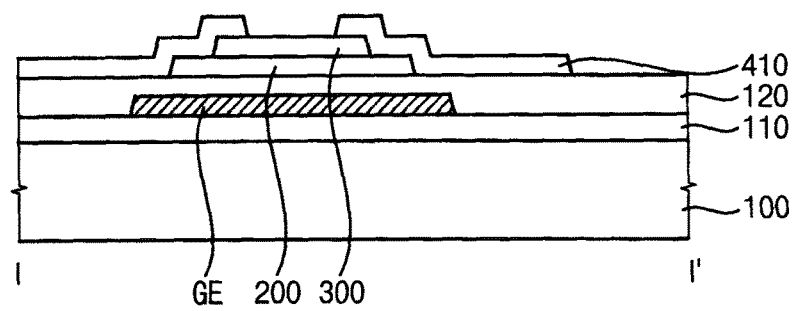

Referring to FIGS. 12 and 13, a signal electrode 410 is provided by etching the signal metal layer 400 using the photoresist pattern PR2 as a mask. The etching process of the signal metal layer 400 may include dry etching or wet etching processes. Then, the photoresist pattern PR2 is removed from the signal electrode 410.

The signal electrode 410 includes a source electrode SE and a drain electrode DE, which are formed from the etching process. The source electrode SE contacts an end portion (e.g., a first end portion) of the oxide semiconductor pattern 200 and partially covers the etch stopper 300. The drain electrode DE contacts another end portion (e.g., a second end portion opposite to the first end portion) of the oxide semiconductor pattern 200 and partially covers the etch stopper 300. According to exemplary embodiments, overlapping area between the signal electrode 410 and the etch stopper 300 may be adjusted to have a predetermined value or to be in a predetermined range.

Figure 14:
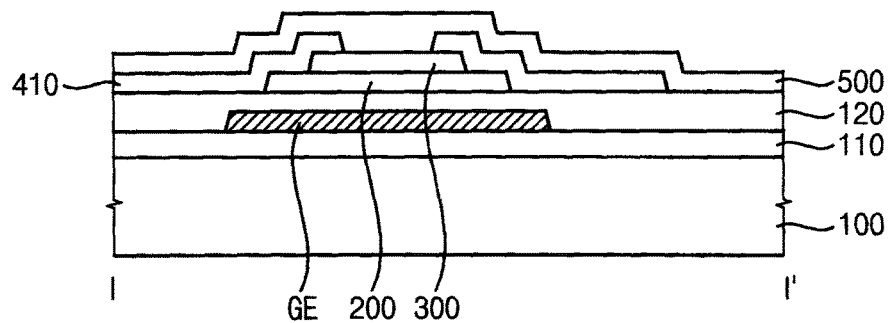

Referring to FIG. 14, a passivation layer 500 is provided on the substrate 100 where the signal electrode 410 is disposed. In one exemplary embodiment, for example, the passivation layer 500 may be provided by a deposition process using a mixed gas of silicon hydride and ammonia ($NH_3$). In an exemplary embodiment, the passivation layer 500 may be provided by a CVD process. In such an embodiment, the passivation layer 500 may be deposited under high-$H_2$ condition in the CVD process.

Figure 15:
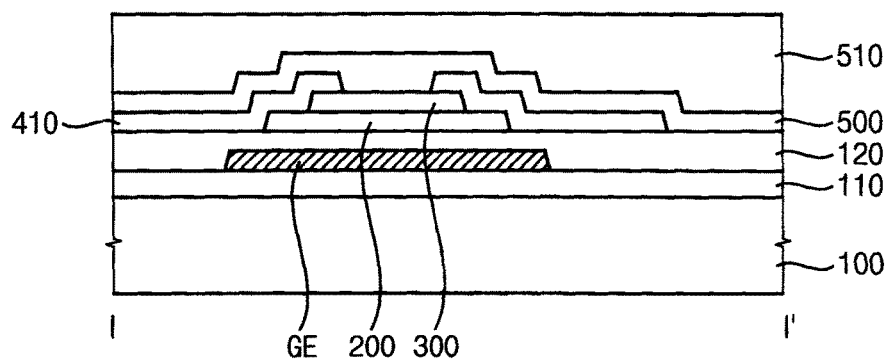

Referring to FIG. 15, a protection layer 510 is provided on the substrate 100 where the passivation layer 500 is disposed. In an exemplary embodiment, the protection layer 510 may have a substantially flat upper surface. In one exemplary embodiment, for example, the protection layer 510 may include an organic insulation layer having photoresist composition such as acryl resin or phenol resin.

Figure 16:
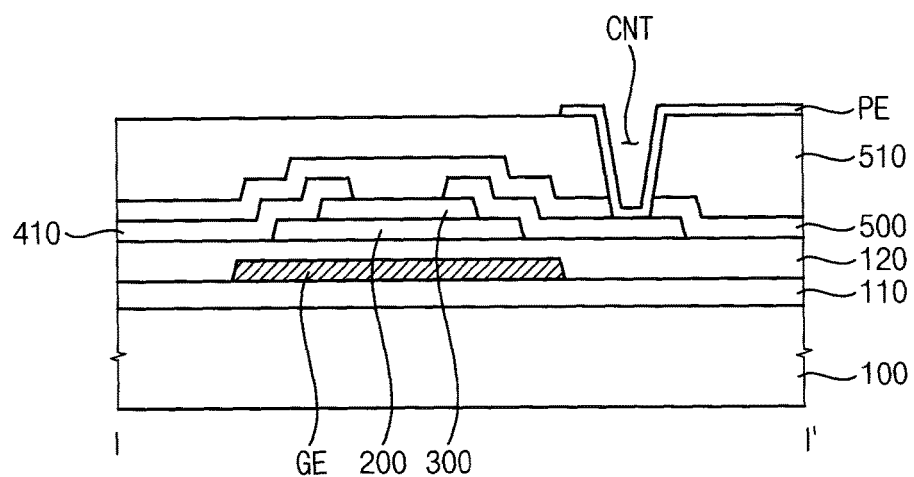

Referring to FIG. 16, a contact hole CNT is formed in the protection layer 510, and a pixel electrode PE is provided on the protection layer 510. The pixel electrode PE contacts the drain electrode DE through the contact hole CNT. The contact hole CNT is defined through the protection layer 510 and the passivation layer 500 corresponding to a portion of the drain electrode DE. In an exemplary embodiment, the pixel electrode PE may include a transparent conductive material. In one exemplary embodiment, for example, the pixel electrode PE may include IZO, ITO, tin oxide (SnOx) or zinc oxide (ZnOx). In one exemplary embodiment, for example, the pixel electrode PE may include aluminum (Al), platinum (Pt), silver (Ag), gold (Au), chromium (Cr), tungsten (W), molybdenum (Mo), titanium (Ti) or a combination thereof.

Figure 17:
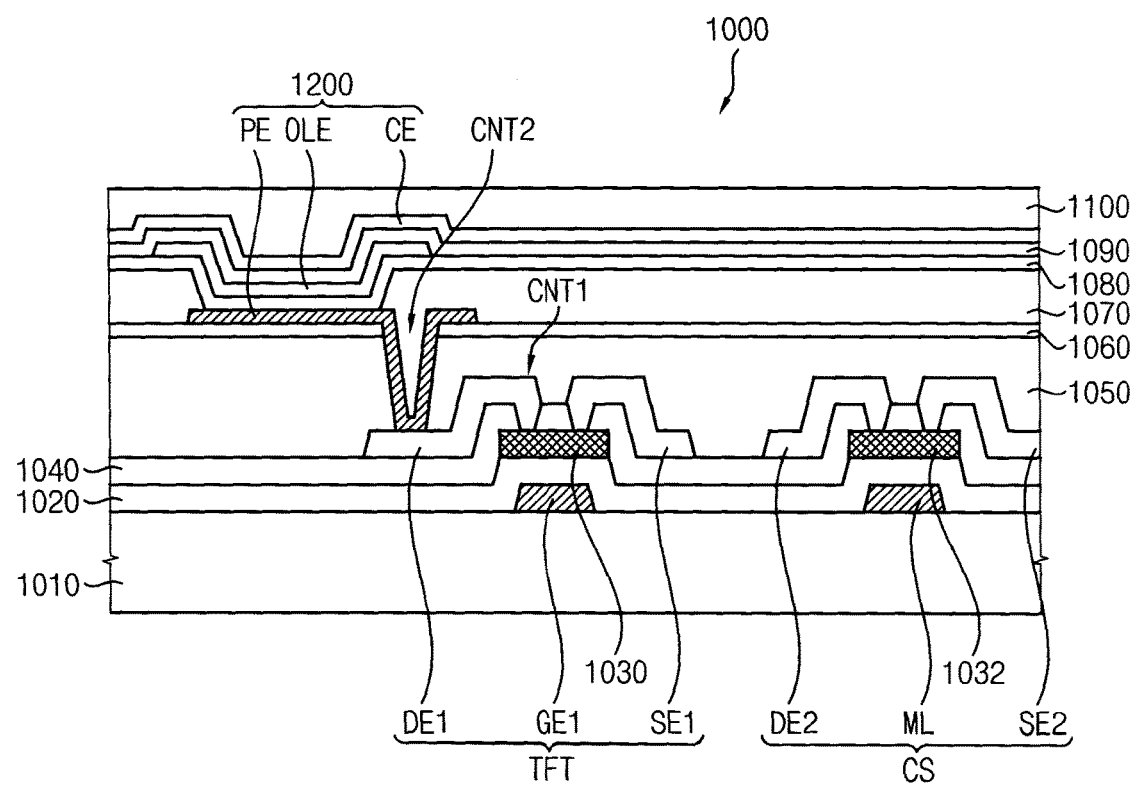
FIG. 17 is a cross-sectional view of an alternative exemplary embodiment of a thin film transistor, according to the invention.

FIG. 17 is a cross-sectional view of an alternative exemplary embodiment of a thin film transistor, according to the invention.

In an exemplary embodiment, the thin film transistor may be disposed in a thin film transistor substrate of an organic light emitting display device. In such an embodiment, the organic light emitting display device 1000 includes a substrate 1010, and a thin film transistor TFT, a capacitor CS and an organic light emitting diode 1200, which are disposed on the substrate 1010.

The thin film transistor TFT and the capacitor CS may be electrically connected to each other, and the organic light emitting display diode 1200 emits light. The organic light emitting display may include a pixel electrode PE disposed in each pixel, a common electrode CE, and an organic light emitting layer OLE disposed between the pixel electrode PE and the common electrode CE. When a voltage is applied to the thin film transistor TFT and the capacitor CS, voltages for driving the organic light emitting display device 1000 are applied to the pixel electrode PE and the common electrode CE. Thus, the organic light emitting layer OLE emits light to display an image.

The thin film transistor TFT includes a gate electrode GE1 disposed on the substrate 1010, a first insulation layer 1020 that covers the gate electrode GE1, a first semiconductor layer 1030 disposed on the first insulation layer 1020, a second semiconductor layer 1040 that covers a portion of the first semiconductor layer 1030, a source electrode SE1 and a drain electrode DE1 that covers a portion of the first semiconductor layer 1030.

A gate signal may be applied to the gate electrode GE1 and the source electrode SE1 may be electrically connected to the pixel electrode PE.

In one exemplary embodiment, for example, the gate electrode GE1 may include molybdenum (Mo), aluminum (Al), chromium (Cr), gold (Au), titanium (Ti), nickel (Ni), neodymium (Nd) or copper (Cu), for example.

In another exemplary embodiment, the gate electrode GE1 may be disposed on the first semiconductor layer 1030 of the thin film transistor TFT.

The first insulation layer 1020 is disposed on the gate electrode GE1 to cover the gate electrode GE1. The first insulation layer 1020 may be provided or formed by a CVD process, a thermal oxidation process, a plasma enhanced chemical vapor deposition ("PECVD") process, or a high density plasma-chemical vapor deposition ("HDP-CVD") process, for example.

The first insulation layer 1020 may include silicon oxide or metal oxide, for example. In one exemplary embodiment, for example, the first insulation layer 1020 may include silicon oxide, silicon oxynitride, hafnium oxide (HfOx), zirconium oxide (ZrOx), aluminum oxide (AlOx), tantalum oxide (TaOx), or a combination thereof, for example.

The first semiconductor layer 1030 may be disposed on a portion of the first insulation layer 1020 under which the gate electrode GE1 is located. In such an embodiment, a semiconductor oxide layer may be provided on the first insulation layer 1020, and then the semiconductor oxide layer may be partially etched by a photolithography process or an etching process using an additional etching mask. Then, the first semiconductor layer 1030 may be provided on the first insulation layer 1020.

The first semiconductor layer 1030 may be formed by a sputtering process, a CVD process, a printing process, a spray process, a vacuum evaporation process, an atomic layer deposition ("ALD") process, a sol-gel process, or a PECVD process, for example. In such an embodiment, the first semiconductor layer 1030 may include a binary compound containing indium, zinc, gallium, titanium, aluminum, hafnium, zirconium, magnesium, or the like, a ternary compound, e.g., including such elements, a quaternary compound, e.g., including such elements, or the like. In another exemplary embodiment, the first semiconductor layer 1030 may include a semiconductor oxide doped with lithium, sodium, manganese, nickel, palladium, copper, carbon, nitrogen, phosphorus, titanium, zirconium, vanadium, rubidium, germanium, tin, fluorine, or a combination thereof. In an exemplary embodiment, the first semiconductor layer 1030 includes amorphous silicon or poly silicon, for example.

The first semiconductor layer 1030 contacts a portion of the source electrode SE1 and the drain electrode DE1 to electrically connect the source electrode SE1 and the drain electrode DE1 through a first contact hole CNT1 defined in the second insulation layer 1040.

The second insulation layer 1040 is disposed on the first semiconductor layer 1030 to protect the first semiconductor layer 1030. The second insulation layer 1040 may be formed by a CVD process, a thermal oxidation process, a PECVD process, or a HDP-CVD process, for example. The second insulation layer 1040 may include a silicon oxide or a metal oxide, for example.

In one exemplary embodiment, for example, the second insulation layer 1040 may include silicon oxide, silicon oxynitride, hafnium oxide (HfOx), zirconium oxide (ZrOx), aluminum oxide (AlOx), tantalum oxide (TaOx), or a combination thereof.

The capacitor CS includes a metal layer ML disposed on the substrate 1010, the first insulation layer 1020 that covers the metal layer ML, the second semiconductor 1032 disposed on the first insulation layer 1020, a second insulation layer 1040 that covers the second semiconductor layer 1032, a source electrode SE2 and a drain electrode DE2 that cover a portion of the second semiconductor layer 1032 and electrically connected to each other through the first contact hole CNT1 defined in the second insulation layer 1040.

The metal layer ML is deposited on substantially a same layer as the gate electrode GE1 of the thin film transistor TFT and includes substantially a same material as the gate electrode GE1.

The metal layer ML may include molybdenum (Mo), aluminum (Al), chromium (Cr), gold (Au), titanium (Ti), nickel (Ni), neodymium (Nd) or copper (Cu), for example.

The first insulation layer 1020 is disposed on the gate electrode GE1 and the metal layer ML. In one exemplary embodiment, for example, the first insulation layer 1020 may include a silicon oxide (SiOx) or a silicon nitride (SiNx).

The second semiconductor layer 1032 is deposited on the same layer as the first semiconductor layer 1030 of the thin film transistor TFT. In one exemplary embodiment, for example, the second semiconductor layer 1032 may include IZO, ITO, GZO, zinc oxide (ZnOx), gallium oxide (GaOx), tin oxide (TiOx), indium oxide (InOx) or a combination thereof.

The source electrode SE2 and the drain electrode DE2 is disposed on the first insulation layer 1020 to cover a portion of the second semiconductor layer 1032.

A passivation layer 1050 is disposed on the second insulation layer 1040, the thin film transistor TFT and the capacitor CS to cover the thin film transistor TFT and the capacitor CS.

In an exemplary embodiment, a light blocking layer 1060 is disposed on substantially entire of a surface of the passivation layer 1050. The light blocking layer 1060 includes a metal oxide or a transparent material. The light blocking layer 1060 may absorb an ultraviolet ray and allow visible light to pass therethrough.

In one exemplary embodiment, for example, the light blocking layer 1060 includes zinc manganese oxide, and a thickness of the light blocking layer 1060 is in a range from about 500 nm to about 1 μm. In an exemplary embodiment, a manganese (Mn) content of zinc manganese oxide (ZnMnO) is in a range from about 15 at % to about 70 at %.

The light blocking layer 1060 may be provided or formed on the passivation layer 1050 by a vacuum deposition process such as a sputtering process or a solution printing process using a solution of zinc manganese oxide.

The pixel electrode PE of the organic light emitting diode 1200 is disposed on the light blocking layer 1060 and electrically connected to the drain electrode DE1 of the thin film transistor TFT through a second contact hole CNT2 defined in the passivation layer 1050 and the light blocking layer 1060.

In one exemplary embodiment, for example, the metal oxide of The light blocking layer 1060 may include zinc manganese oxide, zinc cadmium oxide, zinc phosphorus oxide, or zinc tin oxide.

A pixel electrode PE of the organic light emitting diode 1200 is disposed on the light blocking layer 1060 and electrically connected to the drain electrode DE1 through the second contact hole CNT2.

In one exemplary embodiment, for example, the pixel electrode PE may include a metal oxide. In one exemplary embodiment, for example, the metal oxide of the pixel electrode PE may include zinc manganese oxide, zinc cadmium oxide, zinc phosphorus oxide, or zinc tin oxide, for example.

A pixel defining layer 1070 is disposed on the light blocking layer 1060 and the pixel electrode PE, and an opening is defined in the pixel defining layer 1070 to expose a portion of the pixel electrode PE. The pixel defining layer 1070 functions as an insulator to effectively prevent a short circuit of electrodes and to define each pixel. In one exemplary embodiment, for example, the pixel defining layer 1070 may include a polymer containing a carbon-carbon chain.

A first organic layer 1080 is disposed on an exposed portion of the pixel electrode PE and the pixel defining layer 1070. The first organic layer 1080 may include a hole injection layer or a hole transfer layer. The first organic layer 1080 serves to move efficiently positive holes provided from the pixel electrode PE to improve electrical characteristics of the organic light emitting display device 1000.

In an exemplary embodiment, where the first organic layer 1080 includes the hole injection layer, for example, the first organic layer 1080 may include cupper phthalocyanine ("CuPc"), poly(3,4)-ethylenedioxythiophene ("PEDOT"), polyaniline ("PANI"), N,N-dinaphthyl-N,N'-diphenylbenzidine ("NPD"), etc.

In an exemplary embodiment, where the first organic layer 1080 includes the hole transfer layer, the first organic layer 1080 may include NPD, N,N'-bis-(3-methylphenyl)-N,N'-bis-(phenyl)-benzidine ("TPD"), 2,2',7,7'-tetrakis(N, N-diphenylamine)-9,9'-spirobifluorene ("s-TAD"), or 4,4', 4"-Tris(N-3-methylphenyl-N-phenyl-amino)-triphenylamine ("MTDATA"), for example.

An organic light emitting layer OLE is disposed on the first organic layer 1080. The organic light emitting layer OLE may include a light emitting layer that emits light such as red, green blue or white color light. The organic light emitting layer OLE may include a plurality of light emitting layers, which are laminated on one another.

A second organic layer 1090 is disposed on the organic light emitting layer OLE. The second organic layer 1090 may improve electrical characteristics to a common electrode CE. The second organic layer 1090 may include an electron transfer layer or an electron injection layer.

In an exemplary embodiment, where the second organic layer 1090 includes the electron transfer layer, for example, the second organic layer 1090 may include tris(8-hydroxyquinolino)aluminum ("Alq3"), 2-(4-biphenylyl)-5-(4-tert-butylphenyl-1,3,4-oxadiazole ("PBD"), bis(2-methyl-8-quinolinolato)-4-phenylphenolato-aluminum ("BAlq"), bathocuproine ("BCP"), or a combination thereof.

In an exemplary embodiment, where the second organic layer 1090 includes the electron injection layer, for example, the electron injection layer may include an inorganic material, for example, an alkaline metal, an alkaline earth metal, fluorides of these metals, oxides of these metals, etc. In an alternative exemplary embodiment, the electron injection layer may include organic materials, for example, Alq3 or PBD, for example.

The common electrode CE is disposed on the second organic layer 1090. The common electrode may be an anode or a cathode. In an exemplary embodiment, where the pixel electrode PE is an anode, the common electrode CE is a cathode. In an exemplary embodiment, where the pixel electrode PE is a cathode, the common electrode CE is an anode. The common electrode CE may be a reflective electrode or a transmission electrode according to type of the pixel electrode PE.

In an exemplary embodiment, where a pixel electrode PE may be a transmission electrode, a common electrode CE may be a reflective electrode. The common electrode CE may include aluminum (Al), silver (Ag), gold (Au), platinum (Pt), chromium (Cr), tungsten (W), molybdenum (Mo), titanium (Ti), or palladium (Pd), for example.

In an exemplary embodiment, where a pixel electrode PE may be a reflective electrode, a common electrode CE may be a transmission electrode. The common electrode CE may include IZO, ITO, GZO, zinc oxide (ZnOx), gallium oxide (GaOx), titanium oxide (TiOx), or indium oxide (InOx), for example.

An upper substrate 1100 is disposed on the common electrode CE. The upper substrate 1100 may be a flexible substrate. In an exemplary embodiment, the substrate 1010 and the upper substrate 1100 may include substantially the same material as or different materials from each other. In such an embodiment, the substrate 1100 may correspond to a lower substrate.

According to such an embodiment of the invention described above, the thin film transistor substrate includes a light blocking layer including zinc manganese oxide, such that a transmittance of visible light and a light absorption of ultraviolet ray may be improved. Thus, a degradation of a display panel due to an ultraviolet ray may be effectively prevented and a reliability of a display panel may be improved.

In such an embodiment, a mask is not used when the light blocking layer including zinc manganese oxide is manufactured. Thus, cost of manufacturing a display panel may be reduced.

An exemplary embodiment of a thin film transistor substrate, according to the present invention, may be used in various types of display device.

An exemplary embodiment of a thin film transistor substrate, according to the present invention, may be included in an array substrate of a display device. In an exemplary embodiment, the thin film transistor substrate may be included in a liquid crystal display device, an organic electroluminescent ("EL") display device, a circuit substrate having a thin film transistor, or a semiconductor device, for example.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A thin film transistor substrate, comprising:
   a substrate;
   a data line disposed on the substrate and which extends substantially in a predetermined direction;
   a light blocking layer disposed on the substrate and comprising a metal oxide comprising zinc manganese oxide, zinc cadmium oxide, zinc phosphorus oxide, zinc tin oxide or a combination thereof;
   a gate electrode disposed on the light blocking layer;
   a signal electrode comprising a source electrode, and a drain electrode spaced apart from the source electrode, wherein the source electrode is connected to the data line; and
   a semiconductor pattern disposed between the source electrode and the drain electrode,
   wherein the light blocking layer comprises zinc manganese oxide, and atomic percent of manganese in the zinc manganese oxide is in a range from about 15 atomic percent to about 70 atomic percent, a thickness of the light blocking layer being in a range from about 500 nm to about 1 µm, and
   wherein the light blocking layer absorbs ultraviolet light.

2. The thin film transistor substrate of claim 1, wherein the light blocking layer covers substantially entire of a surface of the substrate.

3. The thin film transistor substrate of claim 1, further comprising:
   a gate insulation layer disposed on the semiconductor pattern,
   wherein the gate electrode is disposed on the gate insulation layer.

4. The thin film transistor substrate of claim 1, further comprising:
   a gate insulation layer disposed under the semiconductor pattern,
   wherein the gate electrode is disposed on the gate insulation layer.

5. The thin film transistor substrate of claim 4, further comprising:
   an etch stopper disposed on the semiconductor pattern.

6. The thin film transistor substrate of claim 1, further comprising:
   a gate line electrically connected to the gate electrode,
   wherein the gate electrode extends from the gate line.

7. The thin film transistor substrate of claim 1, further comprising:
   a passivation layer; and
   a pixel electrode electrically connected to the drain electrode through a contact hole defined in the passivation layer.

8. The thin film transistor substrate of claim 1, wherein each of the source electrode and the drain electrode comprises:
   a copper (Cu) layer; and
   a titanium (Ti) layer disposed on the copper layer or under the copper layer.

9. The thin film transistor substrate of claim 1, wherein the semiconductor pattern comprises zinc oxide (ZnO), zinc tin oxide, zinc indium oxide, indium oxide (InO), titanium oxide (TiO), indium gallium zinc oxide, indium tin zinc oxide, hafnium indium zinc oxide or a combination thereof.

* * * * *